US012658654B2

(12) United States Patent
Simmons et al.

(10) Patent No.: US 12,658,654 B2
(45) Date of Patent: Jun. 16, 2026

(54) SYSTEM FOR SENSING THE POSITION OF A MOVABLE ELECTRICAL CONTACT

(71) Applicant: SANMINA CORPORATION, San Jose, CA (US)

(72) Inventors: Michael C. Simmons, Houston, TX (US); Abbas Arian, Houston, TX (US)

(73) Assignee: Sanmina Corporation, San Jose, CA (US)

( * ) Notice: Subject to any disclaimer, the term of this patent is extended or adjusted under 35 U.S.C. 154(b) by 286 days.

(21) Appl. No.: 18/494,316

(22) Filed: Oct. 25, 2023

(65) Prior Publication Data

US 2024/0154370 A1 May 9, 2024

Related U.S. Application Data

(60) Provisional application No. 63/423,420, filed on Nov. 7, 2022.

(51) Int. Cl.
*G01R 27/06* (2006.01)
*G01R 31/11* (2006.01)
(Continued)

(52) U.S. Cl.
CPC ......... *H01R 13/6683* (2013.01); *G01R 27/06* (2013.01); *G01R 31/11* (2013.01); *H01R 13/2414* (2013.01)

(58) Field of Classification Search
CPC ........ G01B 7/003; G01R 27/06; G01R 31/11; G01R 31/318555; G01R 31/3275; G01R 33/093; G01R 31/318342; G01R 31/31701; G01R 31/085; G01R 31/318594; G01R 31/318536; H01R 13/2414;
(Continued)

(56) References Cited

U.S. PATENT DOCUMENTS

| | | | |
|---|---|---|---|
| 3,701,136 A | 10/1972 | Stevens et al. | |
| 4,270,171 A | 5/1981 | Maples et al. | |
| | | (Continued) | |

FOREIGN PATENT DOCUMENTS

CN     105103207 B     12/2018

OTHER PUBLICATIONS

International Search Report and Written Opinion for corresponding International Patent Application No. PCT/US2023/035864, dated Jan. 17, 2024, 7 pages.

*Primary Examiner* — Vinh P Nugyen

(74) *Attorney, Agent, or Firm* — Joseph G. Swan; LOZA & LOZA, LLP

(57) ABSTRACT

A position sensor assembly includes: a first elongated electrical conductor, a second elongated electrical conductor, extending substantially in parallel with the first elongated electrical conductor, and a movable electrically conductive contact component, configured to move along lengths of the first elongated electrical conductor and the second elongated electrical conductor, simultaneously contacting both of the first elongated electrical conductor and the second elongated electrical conductor at different positions along each of their lengths. In such an assembly, the first elongated electrical conductor and the second elongated electrical conductor typically have a combined resistance of less than 1 ohm per meter. In any event, such an assembly can be used in a signal-reflection-based position-sensing system.

17 Claims, 5 Drawing Sheets

(51) Int. Cl.
　　*H01R 13/24*　　　　(2006.01)
　　*H01R 13/66*　　　　(2006.01)
(58) Field of Classification Search
　　CPC ..... H01R 13/6683; G06F 11/27; G06F 11/32;
　　　　　　　　　　　　G06F 11/3055; G06F 9/30072
　　See application file for complete search history.

(56)　　　　　　　　References Cited

U.S. PATENT DOCUMENTS

| | | | | |
|---|---|---|---|---|
| 4,734,870 A | * | 3/1988 | Snyder | G06F 3/043 |
| | | | | 33/700 |
| 4,951,506 A | * | 8/1990 | Lew | H01H 36/006 |
| | | | | 338/33 |
| 5,347,875 A | * | 9/1994 | Lew | G01F 1/24 |
| | | | | 340/870.37 |
| 5,499,544 A | * | 3/1996 | Lew | G01F 23/68 |
| | | | | 340/870.37 |
| 6,055,857 A | * | 5/2000 | Kerchaert | B60K 35/50 |
| | | | | 73/431 |
| 7,135,873 B2 | | 11/2006 | Mccosh | |
| 7,477,051 B2 | * | 1/2009 | Tse | G06F 3/0362 |
| | | | | 324/609 |
| 7,977,950 B2 | | 7/2011 | Maslen | |
| 9,429,463 B2 | | 8/2016 | Hanson et al. | |
| 11,894,640 B2 | * | 2/2024 | Scruggs | H01R 13/6272 |
| 2003/0062889 A1 | | 4/2003 | Ely et al. | |
| 2016/0283006 A1 | | 9/2016 | Ogura et al. | |
| 2017/0241258 A1 | | 8/2017 | Scott | |
| 2020/0371609 A1 | | 11/2020 | Yamada et al. | |

\* cited by examiner

SYSTEM FOR SENSING THE POSITION OF A MOVABLE ELECTRICAL CONTACT

PRIOR APPLICATIONS

This application claims priority to U.S. Provisional Application Ser. No. 63/423,420 filed Nov. 7, 2022 entitled POSITION SENSOR, which is incorporated herein by reference in its entirety.

FIELD OF THE INVENTION

The present invention pertains, among other things, to systems, apparatuses, components, methods and techniques for sensing or detecting the position of a mechanical component, and it is particularly applicable for use in harsh or severe environmental conditions.

BACKGROUND

The following discussion concerns certain background information related to the present invention and also provides the present inventors': (1) observations regarding and/or characterizations of prior art; and (2) identification and analysis of certain shortcomings in the prior art and/or problems that the present invention addresses. It should be understood that only knowledge clearly, explicitly and specifically described herein as being "conventional" or "prior art" is intended to be characterized as such. Everything else should be understood as knowledge and/or insight originating from the present inventors themselves.

Reliable and accurate detection or sensing of physical position (e.g., linear position, position along a defined path, and/or displacement of a particular component within a larger piece of equipment) in high-pressure, high-temperature and/or other severe environments (such as in connection with the use of downhole tools during oil and/or gas exploration, geothermal drilling, etc.) has always been challenging. At the same time, however, such information often is critical, e.g., in order for equipment operators (typically far removed from the operational location of the relevant equipment) and/or for automated equipment control systems to have good and reliable information regarding the current state of operations. Such downhole sensors, e.g., often are immersed in oil and, in any event, typically are exposed to very high pressures, temperatures, contaminants, etc., which often can significantly degrade the life expectancy of conventional sensors, leading to potential unreliability and the need for relatively frequent and costly replacement.

Position sensing within these environments conventionally has been made using a linear variable-resistance-measurement sensor (i.e., a linear resistance potentiometer) or using a linear-variable-differential-transformer (LVDT) type sensor. For downhole applications, compact tool designs often have required the small form factor of potentiometer sensors. Unfortunately, however, the present inventors have discovered that (1) variable-resistance potentiometers, which are very much dependent upon the integrity of their contact surfaces, have significant reliability issues (e.g., with their plastic resistive elements being particularly susceptible to scratching, wear and other degradation) over time, and (2) contaminants can affect the potentiometer's contact resistance, both leading to irregular and/or inconsistent sensor responses and requiring relatively frequent replacement. At the same time, LVDT-type linear displacement sensors often are too long (by nature of their design), or otherwise not suitable, for many of the tool designs presently being constructed, particularly for downhole applications.

SUMMARY OF THE INVENTION

The present invention addresses the foregoing problems e.g., by providing systems, apparatuses, methods and techniques for position sensing using electrical-signal reflection-based sensors that often can provide improved performance, durability, and reliability and, in many cases, can directly replace (i.e., provide a better retrofit for) potentiometer sensors that currently are included within existing equipment.

Thus, one embodiment of the invention is directed to a system for sensing position that includes: a movable contact assembly, a signal generator, and a signal-timing comparator. The movable contact assembly, in turn, includes: a first elongated electrical conductor, a second elongated electrical conductor, extending substantially in parallel with the first elongated electrical conductor, and a movable electrically conductive contact component, configured to move along lengths of the first elongated electrical conductor and the second elongated electrical conductor, simultaneously contacting both of the first elongated electrical conductor and the second elongated electrical conductor at different positions along each of their lengths. The signal generator has an output coupled so as to provide a time-varying periodic signal to an input end of the first elongated electrical conductor. The signal-timing comparator has: a first input coupled to the output of the signal generator, a second input coupled so as to receive a reflected signal from the input end of the first elongated electrical conductor, and an output providing a signal indicative of a timing difference between signals at the first input and the second input of said signal-timing comparator, thereby also being indicative of a current position of the movable electrically conductive contact component.

Another embodiment of the invention is directed to a position sensor assembly that includes: a first elongated electrical conductor; a second elongated electrical conductor, extending substantially in parallel with the first elongated electrical conductor; and a movable electrically conductive contact component, configured to move along lengths of the first elongated electrical conductor and the second elongated electrical conductor, simultaneously contacting both of the first elongated electrical conductor and the second elongated electrical conductor at different positions along each of their lengths. It is a feature of this embodiment that the first elongated electrical conductor and the second elongated electrical conductor have a combined resistance of less than 1 ohm per meter.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED
EMBODIMENT(S)

Figure 1:
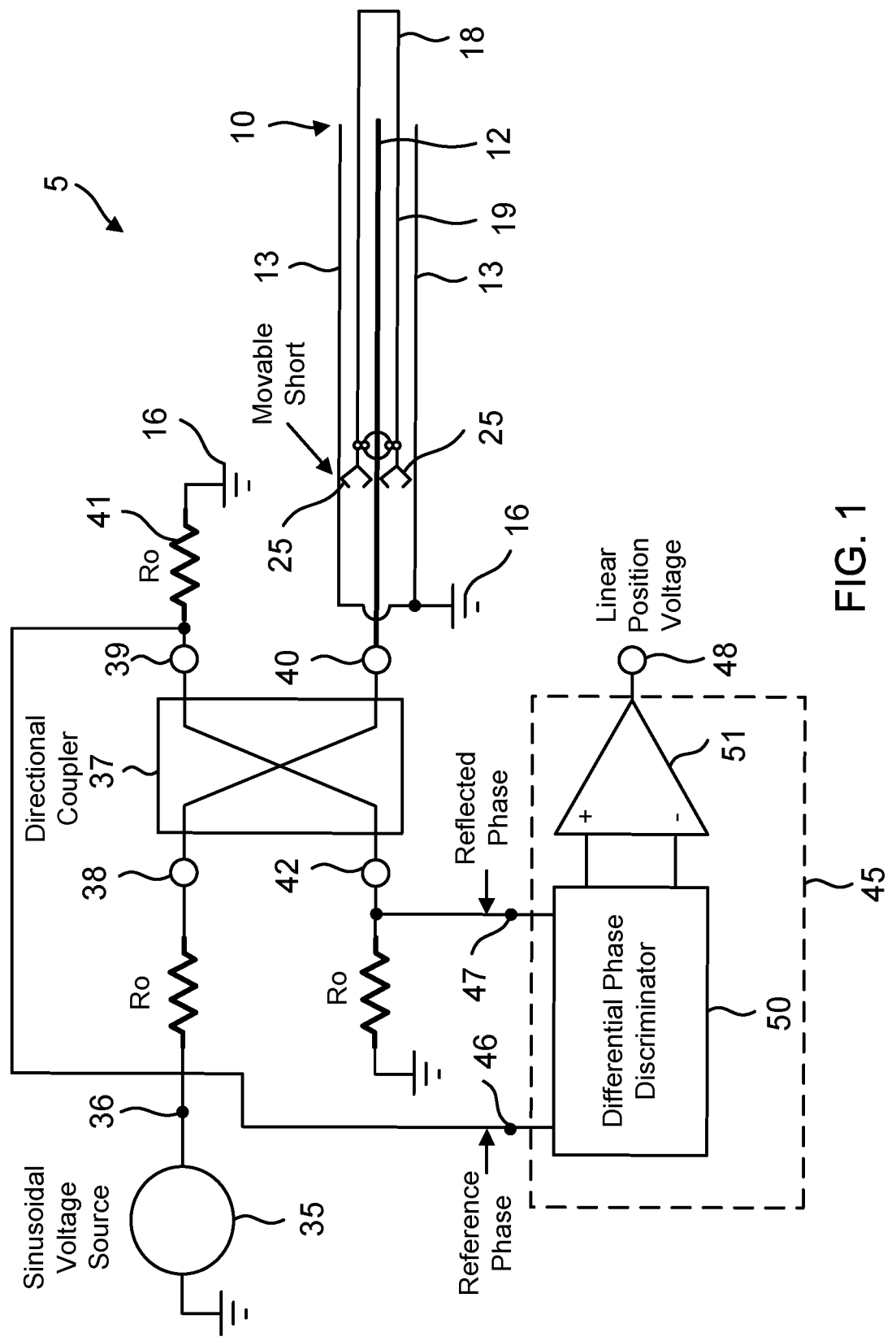
FIG. 1 is a simplified block/circuit diagram illustrating a position-sensing system according to certain representative embodiments of the present invention.

FIG. 1 illustrates a representative system 5 for sensing position in accordance with the present invention. In system 5, a movable contact assembly 10 includes two elongated electrical conductors 12 and 13 that extend substantially in parallel with each other (e.g., meaning that, while the two conductors 12 and 13 are separated, for each point along the relevant length of conductor 12 there is a corresponding and/or adjacent point on conductor 13). Depending upon the specific embodiment, elongated conductors 12 and 13 are separated by air, a dielectric oil, or another (preferably, e.g., so as to permit movement through it, gaseous or liquid, but in some embodiments, semi-solid) dielectric.

In the currently preferred embodiments, one of such conductors (conductor 13 in the present example) surrounds and is coaxial with the other (conductor 12 in this example). More specifically, in this particular embodiment, conductor 13 is a straight conductive tube, and conductor 12 is a straight conductive rod (e.g., with conductor 13 providing electromagnetic shielding for conductor 12), essentially providing a transverse electromagnetic (TEM) coaxial transmission line. Both conductors 12 and 13 preferably are made of copper or some other highly conductive material (e.g., having a combined resistance of less than 1.0, 0.1 or even 0.01 ohm/meter). As shown in FIG. 1, conductor 13 is coupled (directly connected in this example) to ground 16, while conductor 12 is coupled to other portions of system 5. Although the foregoing configuration is preferred, it should be understood that various other configurations of substantially parallel elongated conductors 12 and 13 (e.g., side-by-side conductors) are used in alternate embodiments of the invention.

Movable contact assembly 10 also includes a movable structure 18 that can be moved (e.g., slid) to desired positions along the length of conductors 12 and 13. In the current embodiment, the main body of movable structure 18 is an elongated member 19 in the form of a tube having a hollow core in the current embodiment in order to accommodate elongated conductor 12 and so as to be capable of being moved (e.g., sliding) along and/or between elongated conductors 12 and/or 13. In the current embodiment, movable structure 18 slides between elongated conductors 12 and 13 such that there typically is surface-to-surface contact between tube 19, on one hand, and conductor 12 and/or 13, on the other. However, in alternate embodiments, such sliding can involve one or more intermediate structures.

Electrically conductive contact component 25 is the main operative part of movable structure 18. In the current embodiment, it: (1) is fixedly attached to the proximal end 20 of tube 19; (2) extends between elongated electrical conductors 12 and 13, providing a movable electrical short between them; and (3) is capable of moving along a substantial portion (e.g., at least 70-90%) of electrical conductors 12 and 13, thereby establishing an electrical connection between them at different positions. Additional detail regarding the currently preferred embodiment of movable structure 18 and electrically conductive contact component 25, in particular, is provided below in connection with the discussion of FIGS. 2 and 3.

As shown in FIG. 1, the other main components of system 5 are: signal generator 35, directional coupler 37 and signal-timing comparator 45. In the currently preferred embodiment, for the reasons indicated below, signal generator 35 is a sinusoidal voltage source. However, in alternate embodiments, signal generator 35 provides other types of (preferably time-varying, periodic) signals. In the preferred embodiments, the frequency of the signal output by signal generator 35 is at least 1 Megahertz (MHz). In certain embodiments, the output frequency corresponds to a wavelength (taking into account propagation speed through the transmission line formed by conductors 12 and 13, as was the dielectric constant of the material separating them) that is $1/16$ to $1/4$ (e.g., approximately $1/8$) of the maximum position range (i.e., the distance from the nearest position to the furthest position) that is to be accommodated. In many embodiments, the frequency of the signal output by generator 35 will be more than 10 or 20 MHz. In one particular embodiment (in which the maximum position range is approximately 16 inches and the dielectric constant of the material between conductors 12 and 13 is approximately 2), the frequency is set to 30 MHz.

The output 36 of signal generator 35 is coupled to one end (i.e., the proximal end) of one of the elongated conductors (elongated conductor 12 in the present example). More specifically, in the current embodiment, the signal at output 36 is coupled to elongated conductor 12 through directional coupler 37, from its input port 38 to one of the forward ports 39 and 40 (coupled port 40 in the present example), with the other forward port (through-port 39 in the present example) being matched in impedance (using resistor 41) and terminated. In a slightly different implementation, the connections to directional coupler ports 39 and 40 are reversed from what is shown in FIG. 1 (i.e., with through-port 39 being coupled to the proximal end of elongated conductor 12 and with coupled port 40 being matched and terminated). In the current embodiment, the coaxial transmission line formed by conductors 12 and 13 is a characteristic impedance of 50 ohms ($\Omega$), and all of the matching impedances are resistors having a resistance (R0) of 50$\Omega$.

The output 36 of signal generator 35 also is coupled to one input 46 of signal-timing comparator 45 (in the preferred embodiment, through directional coupler 37, using the output of directional coupler 37 at its through-port 39), with the other input 47 of signal-timing comparator 45 being coupled to isolated (or coupled) reverse port 42 of directional coupler 37. As a result, signal-timing comparator 45 receives both the original signal (provided by signal generator 35, in this case, from the through-port 39 of directional coupler 37, but in any event, prior to having been provided to movable contact assembly 10) and a reflected signal (i.e., the output of directional coupler 37's port 42). In this regard, as noted above, movable contact component 25 provides a short between conductors 12 and 13 at the position where it contacts them, resulting in an impedance mismatch at that position and, correspondingly, causing a portion of the input signal (provided by generator 35) to be reflected backwards (i.e., in the reverse direction down conductor 12, from the point of the short back toward the proximal end of elongated electrical conductor 12). It is this reflected signal that is output by port 42 of directional coupler 37.

The main functions of signal-timing comparator 45 are: (1) to identify a timing differential between the signals at its inputs 46 and 47; and (2) to output a signal that indicates that timing differential and, therefore, also indicates the position of the short caused by movable contact component 25 and, by extension, the position of any other point that moves in unison with that short (e.g., other points on movable structure 18 in general, or anything else rigidly attached to or otherwise moving in a predictable manner when movable structure 18 changes position).

For the purpose of identifying the timing differential between the signals on signal-timing comparator 45's inputs 46 and 47, in the current embodiment (in which the signal generator 35 outputs a sinusoidal), signal-timing comparator 45 preferably is primarily implemented using a differential phase discriminator 50, which determines the phase difference between such input signals. In one specific embodiment, signal-timing comparator 45 normalizes (e.g., so that they have the same amplitudes) and then multiplies the two signals and, thereafter, low-pass filters the result (e.g., using a simple filter to eliminate the portion of the result that is at twice the frequency of the original signal); the resulting filtered signal then is proportional to the phase difference between the two original input signals, and that phase difference is directly proportional to the difference in distances that the two signals traveled, so the position of the short can be determined in a very straightforward manner.

For purposes of normalizing the input signals, in certain embodiments signal-timing comparator 45 includes power or magnitude estimation modules and then one or more amplifiers for adjusting either or both signals to equalize them. In alternate embodiments, the power or magnitude differential is measured or determined and then subsequently used in downstream processing to adjust the results. In either event, it is noted that the preferred approach of the present invention is to solely focus on the timing or phase differential between the input signal and the reflected signal. Unlike conventional sensors, magnitude differentials are largely irrelevant, except to the extent that they might affect determination of such timing or phase differentials, and then they can be easily corrected or compensated (e.g., through normalization). As a result, when compared to potentiometer position sensors, a position-sensing system 5 according to the present invention can be much less sensitive to variations in contact resistance as a result of contamination, wear, etc.

In alternate embodiments of the invention, signal-timing comparator 45 is implemented in other ways, e.g., depending upon the nature of the signal output by generator 35 (which can be, e.g., any other time-varying, preferably periodic signal, such as a square wave). Also, it should be noted that signal-timing comparator 45 can detect the timing differential using analog circuitry (e.g., as in the present embodiment), digital techniques (e.g., after sampling and/or quantizing the input signals), or any combination of the two (e.g., using analog processing to multiply the signals and then low-pass filter the result, followed by digitization before performing additional processing), as will be readily apparent to one of ordinary skill in the art.

Once the timing (e.g., phase) differential has been determined, adjustments preferably are made to account for any differences in propagation delays that are not attributable to the position of the short itself. For instance, in the current embodiment, the distance between the output 40 and the proximal end of elongated electrical conductor 12 may be extended. As a result, a corresponding timing (e.g., phase)

adjustment preferably is made, and then the remaining timing differential is divided by two to account for the fact that the signal input into the proximal end of elongated electrical conductor 12 makes a round-trip from that point to the electrical short and back. In addition, if it is desired to identify the position of any point other than the specific point where the electrical short has occurred, another adjustment preferably is made (either in signal-timing comparator 45 itself or in subsequent downstream processing). In any event, in the current embodiment, signal-timing comparator 45 also includes a differential amplifier 51 for driving any downstream components. Circuitry and/or processing algorithms/software for performing such adjustments is straightforward and, therefore, not shown in the attached drawings or discussed here in detail.

As indicated above, the output 48 of signal-timing comparator 45 provides a signal indicating where, along the length of the electrically driven electrical conductor (elongated electrical conductor 12 in this example), the conductive contact component 25 makes contact (while simultaneously contacting elongated electrical conductor 13). That position, in turn, can be used to determine the position or displacement of rod 19 (or whatever other movable or slidable mechanism is used, e.g., in alternate embodiments) and, therefore, or any other movable component attached to tube 19 or, more generally, movable structure 18.

In certain embodiments, the voltage at output 48 varies linearly or approximately linearly with the position of the movable short (i.e., the position where contact component 25 contacts elongated conductor 12 in the present embodiment). For example, in the embodiment described above (in which the signals that inputs 46 and 47 are multiplied and then the result is low-pass filtered), the resulting signal is proportional to the position or displacement. Although not shown in FIG. 1, the signal at output 48 (either directly or after sampling/digitization) typically will be: (1) used to drive a display showing such position or displacement to a user and/or (2) input to another system for automatically controlling one or more electromechanical actuators.

Figure 2:
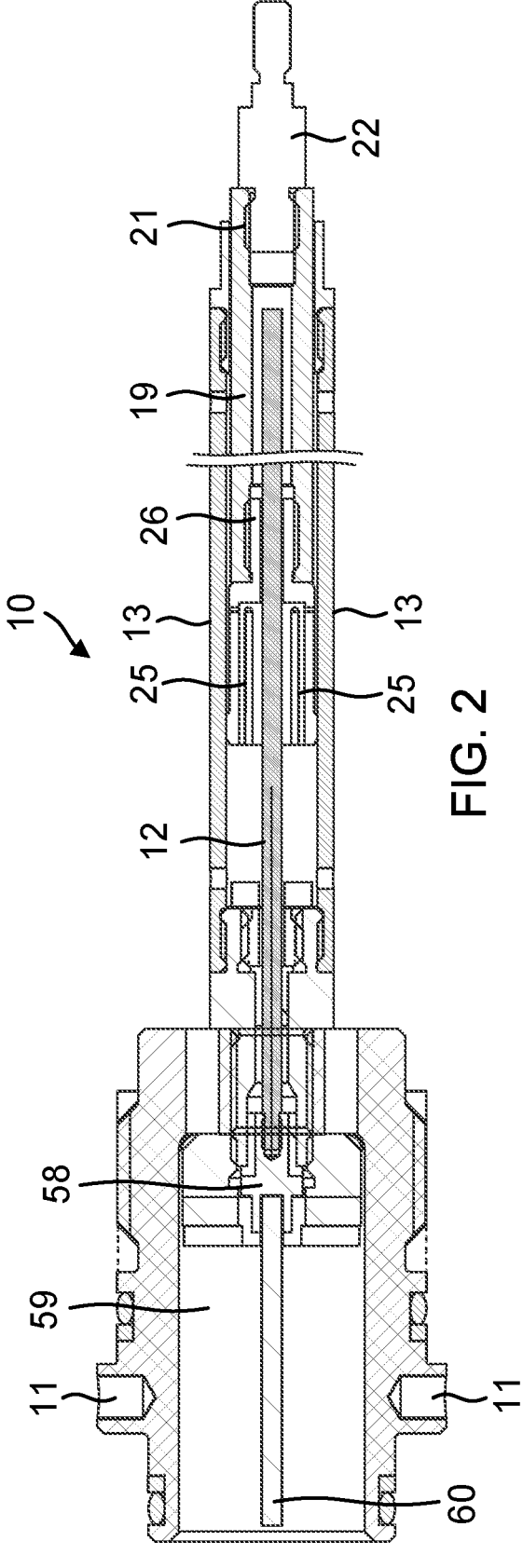
FIG. 2 is a side cross-sectional view of a movable contact assembly.

FIG. 2 provides a more detailed view of movable contact assembly 10. In this embodiment, connector assembly 58 attaches to elongated electrical conductors 12 and 13, connecting them to the electronics (as if discussed above, but not shown in detail here), which preferably are provided within space 59. In alternate embodiments, a (preferably coaxial) cable 60 connects elongated conductors 12 and 13 to external electronics instead (or in addition).

The distal end 26 of electrically conductive contact component 25 inserts into tube 19 (e.g., screwed in using meeting threaded surfaces or, in certain embodiments, simply pressed in). Preferably, contact component 25 can be removed and replaced if needed. In any event, electrically conductive contact component 25 preferably is fixedly attached to tube 19, so that they move in unison.

Figure 3:
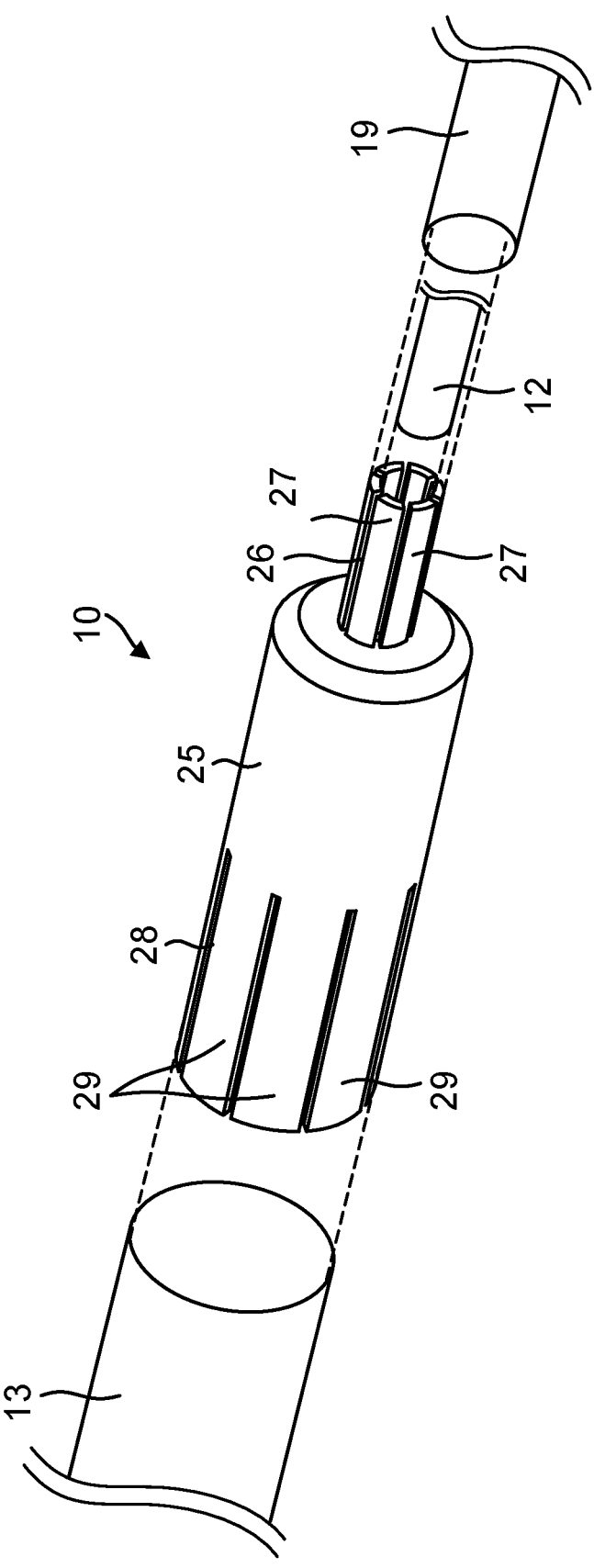
FIG. 3 is an exploded perspective view of a portion of a movable contact assembly, centered around its electrically conductive contact component.

FIG. 3 illustrates the electrically conductive contact component 25 in greater detail, along with its relationship to other components of movable contact assembly 10 in the current embodiment. As shown, distal end 26 of electrically conductive contact component 25 is narrower than its proximal end 28, and the outer surface of the distal end 26 engages with the inner surface of tube 19, thereby fixing electrically conductive contact component 25 to tube 19. In the current embodiment, this is accomplished using a set of separated fingers or contact elements 27 that provide a compression fit. However, as noted above, in alternate embodiments, the outer surface of distal end 26 instead is provided with threads that mate with corresponding threads on the inner surface of tube 19, or electrically conductive contact component 25 attaches to tube (or, more generally, elongated member) 19 in any other manner. In any event, in the current embodiment contact elements 27 are angled slightly inwardly, and the entire electrically conductive contact component 25 is made of a resilient or spring-like material (e.g., aluminum bronze, beryllium copper, or 17-7 stainless steel) that preferably maintains stiffness in the anticipated environment (e.g., in many cases, at temperatures of approximately 400° Fahrenheit). As a result, the inner distal edge of such distal end 26 maintains constant (although preferably light, e.g., not more than 5-10 pounds per square inch) contact with the outer surface of elongated electrical conductor 12. Similarly, the proximal end 28 of electrically conductive contact component 25 preferably also includes a set of separated fingers or contact elements (contact elements 29) that preferably are angled slightly outwardly, so that they make constant (again, preferably light, e.g., not more than 5-10 pounds per square inch) contact with the inner surface of elongated electrical conductor 13. In this manner, electrically conductive contact component 25 moves along with tube 19, continuously making contact with elongated conductors 12 and 13 at different points along their lengths.

Figure 4A:
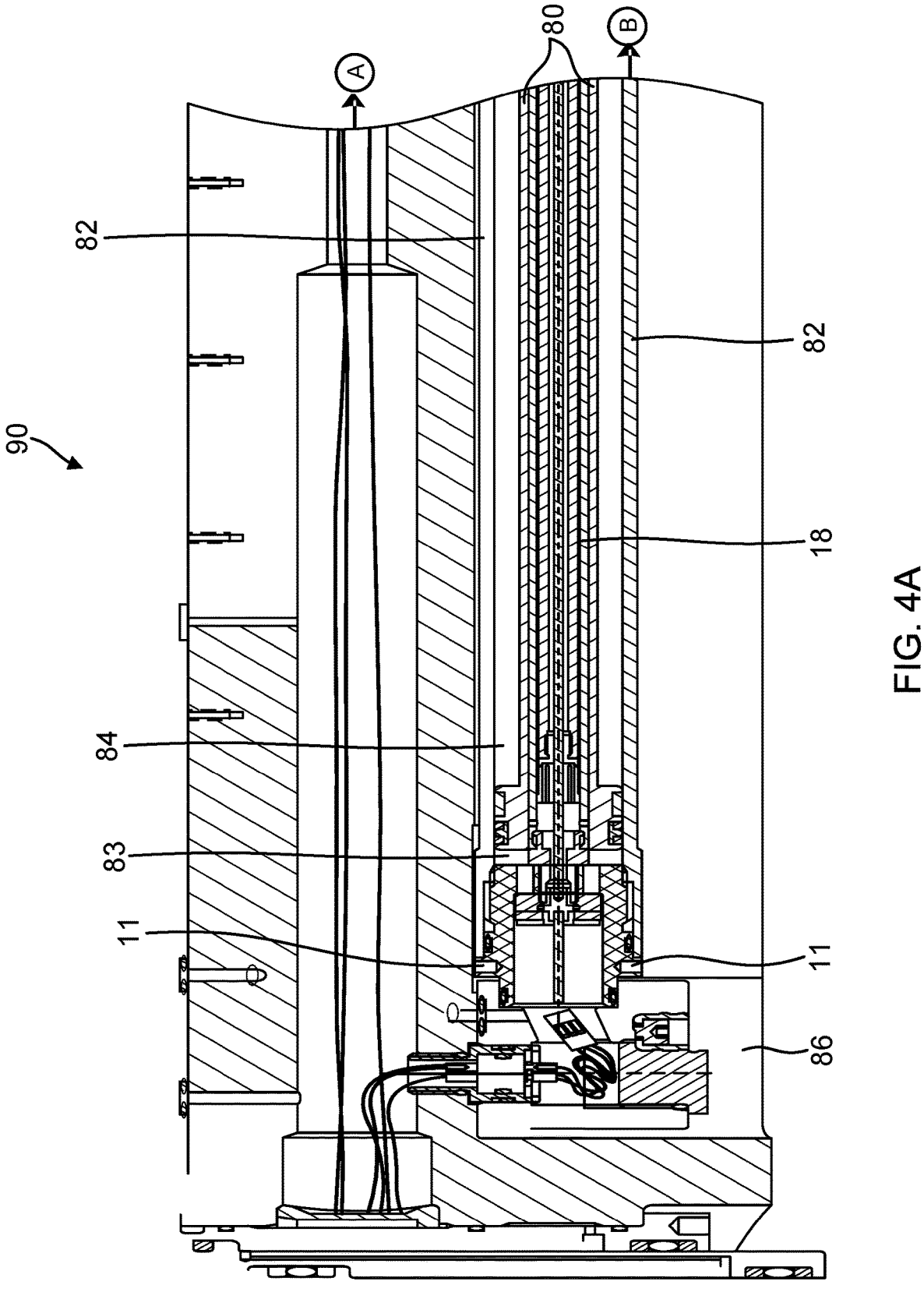
FIG. 4 is a side cross-sectional view of larger assembly that includes both a piston and a movable contact assembly, with FIG. 4A showing the proximal end and FIG. 4B showing the distal end.
Figure 4B:
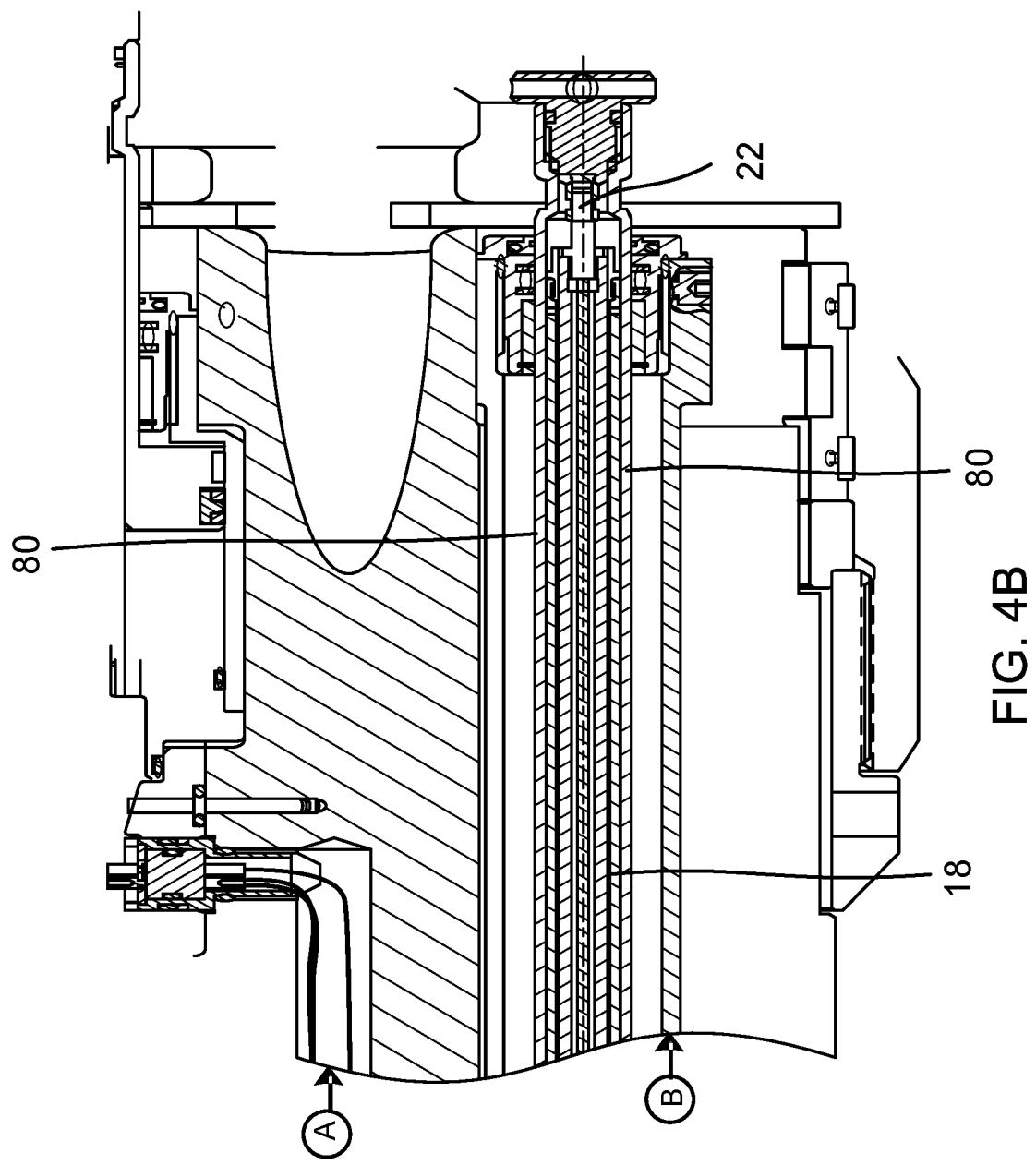

Returning briefly to FIG. 2, the proximal end of movable contact assembly 10 is provided with two or more female threaded openings 11 and/or other mounting hardware for fixedly attaching to other component(s) and/or equipment, and the distal end 21 of tube 19 is provided with an attachment element 22 for attaching to another component. FIG. 4 then illustrates one particular embodiment in which movable structure 18 is attached or mechanically coupled to an actuator, in this case a piston 80 that is hydraulically driven within cylinder 82. More specifically, hydraulic pressure provided within space 83 extends the piston 80, and hydraulic pressure provided within space 84 retracts the piston 80. Attachment element 22 is threaded into an opening near the distal end of piston 80, so that piston 80 brings movable structure 18 along with it as it extends and retracts. The proximal end of movable contact assembly 10 is attached to the housing 86 of piston assembly 90, using screws threaded into openings 11. As a result of this structure, e.g., it can be possible to monitor the position or state of the actuator (e.g., how far the piston 80 is extended from within its corresponding cylinder 82) from a significant distance away and/or in any other situations where visibility is otherwise limited or nonexistent.

Use of a movable contact assembly according to the present invention obviates any need to use conductive plastic which, as noted above, is subject to significant degradation. At the same time, such a movable contact assembly typically can be provided in a form factor that directly replaces an existing variable-resistance-measurement sensor (i.e., a potentiometer). In the embodiment above, conductors 12 and 13 are straight, permitting measurement of linear position or displacement, at least nominally (although additional mechanisms can translate such a linear range of motion into other forms of motion, as is well known in the art). However, in alternate embodiments, conductors 12 and 13 are provided with any desired (e.g., curved) shape. In any event, conductors 12 and 13 preferably are rigid, semi-rigid or at least shape-retaining, or some other means is used to maintain separation between them.

Generally speaking, movable contact assembly 10 can be mounted or otherwise mechanically coupled between any two positions where it is useful to have a signal indicating the distance between such positions. In any event, movement of the movable structure 18 results in a corresponding movement of electrically conductive contact component 25, so that it contacts different positions along each of elongated electrical conductors 12 and 13, e.g., from at or close to their proximal ends to at or close to their distal ends.
System Environment.

In many embodiments, system 5 is part of a larger (e.g., control) system that includes one or more programmable general-purpose computers and/or other computing devices that receive position signals and/or information from system 5 and then process, display and/or use such information. Such devices typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive, a solid-state drive, or any other type of internal storage device); (11) a real-time clock; (12) a removable storage read/write device (such as a flash drive, a memory card, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop or tablet) computers and/or smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

ADDITIONAL CONSIDERATIONS

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

As used herein, the term "attached", or any other form of the word, without further modification, is intended to mean directly attached, attached through one or more other intermediate elements or components, or integrally formed together. In the drawings and/or the discussion, where two individual components or elements are shown and/or discussed as being directly attached to each other, such attachments should be understood as being merely exemplary, and in alternate embodiments the attachment instead may include additional components or elements between such two components. Similarly, method steps discussed and/or claimed herein are not intended to be exclusive; rather, intermediate steps may be performed between any two steps expressly discussed or claimed herein.

Unless otherwise clearly stated herein, all relative directions (e.g., left, right, top, bottom, above, below) mentioned herein in relation to an article are from the perspective of the article itself and, therefore, are consistent across different views.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the preceding discussion, the terms "operators", "operations", "functions" and similar terms refer to method or process steps or to hardware components, depending upon the particular implementation/embodiment.

In the event of any conflict or inconsistency between the disclosure explicitly set forth herein or in the accompanying drawings, on the one hand, and any materials incorporated by reference herein (whether explicitly or by operation of any applicable law, regulation or rule), on the other, the present disclosure shall take precedence. In the event of any conflict or inconsistency between the disclosures of any applications or patents incorporated by reference herein, the disclosure most recently added or changed shall take precedence.

For purposes of the present disclosure, any explicit or implicit reference to any data items being included within the same database record means that such data items are linked together or logically associated with each other. Also, except to the extent clearly and expressly indicated to the contrary, references herein and/or in the accompanying drawings to information being included within a database, or within different databases, are not to be taken as limiting; rather, such references typically are intended to simplify and/or more clearly illustrate the subject discussion, and in alternate embodiments any or all of the referenced information can be distributed across any number of database structures, as is well-understood in the art.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

What is claimed is:

1. A system for sensing position, comprising:
   a movable contact assembly that includes
      a first elongated electrical conductor,
      a second elongated electrical conductor, extending substantially in parallel with the first elongated electrical conductor, and
      a movable electrically conductive contact component, configured to move along lengths of the first elongated electrical conductor and the second elongated electrical conductor, simultaneously contacting both of the first elongated electrical conductor and the second elongated electrical conductor at different positions along each of their lengths;
   a signal generator having an output coupled so as to provide a time-varying periodic signal to an input end of the first elongated electrical conductor;
   a signal-timing comparator having: a first input coupled to the output of the signal generator, a second input coupled so as to receive a reflected signal from the input end of the first elongated electrical conductor, and an output providing a signal indicative of a timing difference between signals at the first input and the second input of said signal-timing comparator, thereby also being indicative of a current position of the movable electrically conductive contact component.

2. A system according to claim 1, wherein the time-varying periodic signal is a sinusoid.

3. A system according to claim 2, wherein the signal-timing comparator comprises an analog phase discriminator.

4. A system according to claim 1, wherein the signal-timing comparator comprises a signal multiplier that multiplies a signal provided to the first elongated electrical conductor and the reflected signal.

5. A system according to claim 1, wherein the time-varying periodic signal has a frequency of at least 1 Megahertz (MHz).

6. A system according to claim 5, wherein the frequency of the time-varying periodic signal is at least 10 MHz.

7. A system according to claim 1, wherein the second elongated electrical conductor surrounds the first elongated electrical conductor.

8. A system according to claim 7, wherein the first elongated electrical conductor is coaxial with the second elongated electrical conductor.

9. A system according to claim 1, wherein the movable electrically conductive contact component is part of a larger movable contact assembly that also includes an elongated member that slides along at least one of the first elongated electrical conductor or the second elongated electrical conductor.

10. A system according to claim 9, wherein the elongated member is tubular and has a length of at least 50% of the length of the first elongated electrical conductor.

11. A system according to claim 10, wherein the elongated member surrounds the first elongated electrical conductor.

12. A system according to claim 9, wherein the larger movable contact assembly is mechanically coupled to a piston that is driven within a cylinder, thereby causing the movable electrically conductive contact component to slide along the first and second elongated electrical conductors when the piston is driven.

13. A system according to claim 1, wherein the output of the signal generator is coupled to the input end of the first elongated electrical conductor through a forward path of a directional coupler, and the input end of the first elongated electrical conductor is coupled to the second input of the signal-timing comparator through a reverse path of the directional coupler.

14. A system according to claim 1, wherein the first input of the signal-timing comparator is coupled to the output of the signal generator through a second forward path of the directional coupler.

15. A system according to claim 1, wherein the movable electrically conductive contact component contacts at least one of the first elongated electrical conductor or the second elongated electrical conductor via a plurality of contact elements that are separated from each other.

16. A system according to claim 15, wherein said contact elements are made of a spring-like material.

17. A system according to claim 1, wherein the first elongated electrical conductor and the second elongated electrical conductor have a combined resistance of less than 1 ohm per meter.

* * * * *